United States Patent [19]

Mather

[11] Patent Number: 5,034,568

[45] Date of Patent: Jul. 23, 1991

[54] PACKAGE STRUCTURE FOR MULTICHIP MODULES

[75] Inventor: John C. Mather, Cedar Rapids, Iowa

[73] Assignee: Rockwell International Corporation, El Segundo, Calif.

[21] Appl. No.: 523,149

[22] Filed: May 14, 1990

[51] Int. Cl.$^5$ .................. H01L 23/02; H05K 5/06
[52] U.S. Cl. .................. 174/52.4; 174/52.3; 357/74
[58] Field of Search .......... 357/72, 70, 74, 80; 174/52.4, 52.3; 361/397, 400

[56] References Cited

U.S. PATENT DOCUMENTS

| | | | |
|---|---|---|---|
| 4,355,463 | 10/1982 | Burns | 29/827 |
| 4,688,075 | 8/1987 | Phy | 357/80 |
| 4,744,009 | 5/1988 | Grabbe et al. | 174/52.4 |

*Primary Examiner*—Leo P. Picard
*Assistant Examiner*—Bot L. Ledynh
*Attorney, Agent, or Firm*—John J. Horn; M. Lee Murrah; H. Fredrick Hamann

[57] ABSTRACT

A package for enclosing and mounting a multichip module in which separate mechanisms are provided for mechanically attaching the package to a circuit board and for electrically connecting the package to the circuit board to which it is attached. The package includes a ceramic base on which the multichip module is supported, a frame-like retaining ring which enables the attachment of the package to the circuit board and a lid for covering the top of the package and sealing it off from environmental influences. The package also includes a set of electrical leads extending from the interior to the exterior of the package for providing multiple separate connections between the multichip module and the circuit board on which it is mounted.

13 Claims, 3 Drawing Sheets

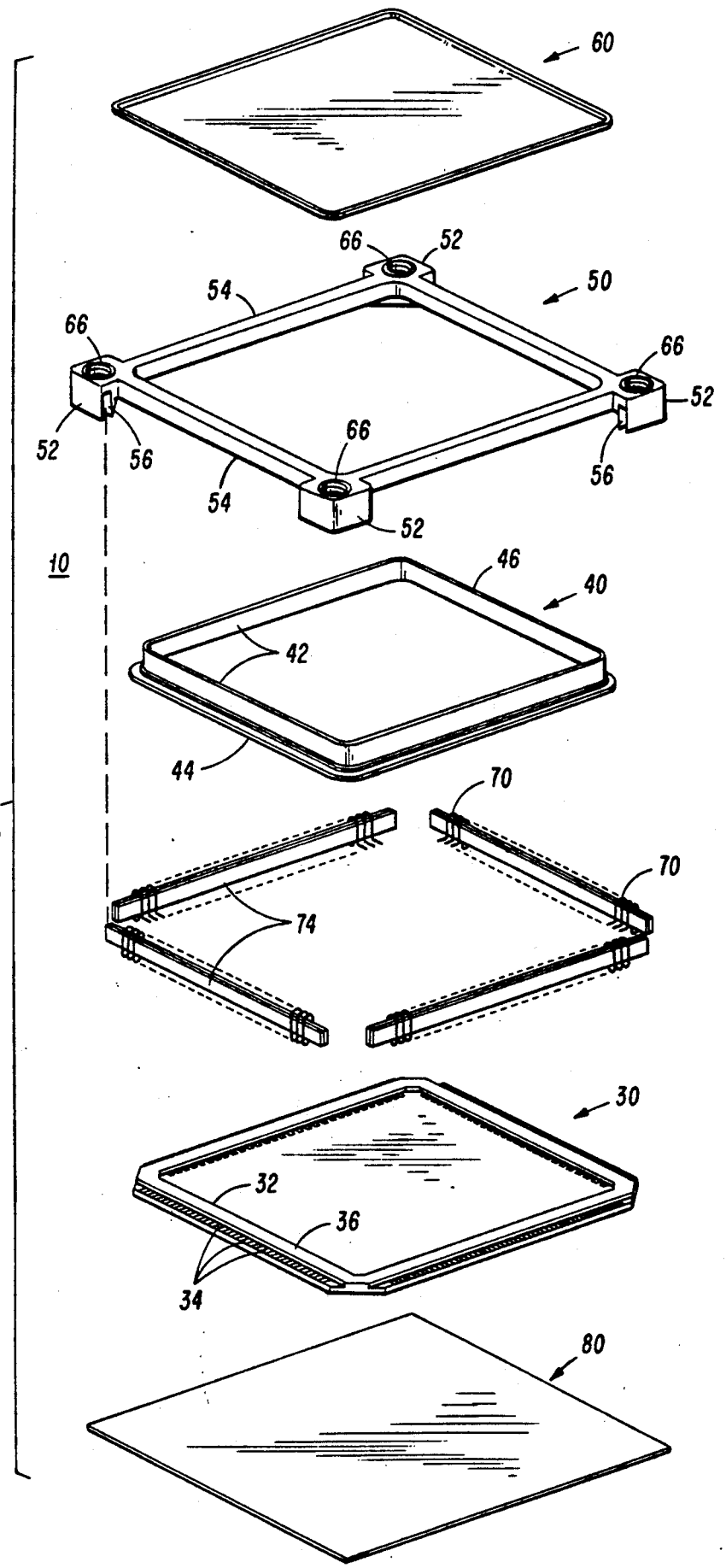

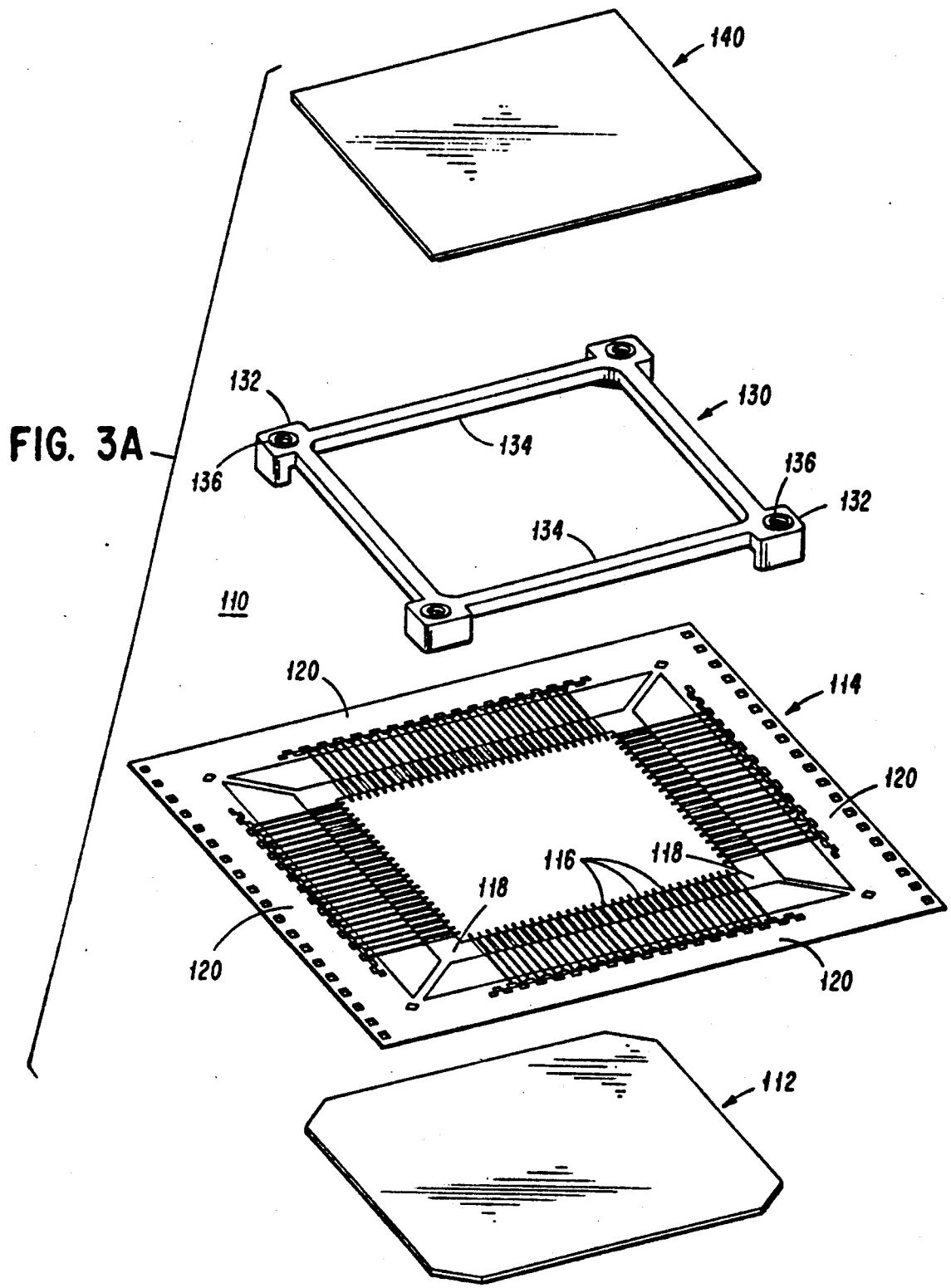

PACKAGE STRUCTURE FOR MULTICHIP MODULES

BACKGROUND OF THE INVENTION

The present invention relates to mounting structures for integrated circuit chips and more particularly to packages for mounting multichip modules on printed circuit boards.

It has become increasingly common to use multichip modules to mount subassemblies of integrated circuit chips on printed circuit boards. Such modules frequently include several integrated circuit chips supported on a planar silicon base which includes a fine-line multilayer structure for electrically interconnecting the chips. Most multichip modules are enclosed within packages which are intended to protect them from adverse environmental influences such as moisture and allow for the modules to be mechanically attached and electrically connected to circuit boards. In the past, the packages for multichip modules have generally been metal casings of the type used in thick and thin film hybrid microelectronics having small apertures within their side walls for allowing glass encapsulated leads to pass through the walls of the casings. The leads have served both to mechanically attach the package to the circuit board and electrically connect the module to the circuit board. The performance of such packages has been poor on account of the delicate nature of this method of mechanical attachment and mismatches between the coefficients of thermal expansion of the components of the package and the circuit board on which the package is mounted. In particular, the leads extending out from the package have been a design problem because, if they are chosen to be thin and compliant, they provide little protection against vibration and shock while, if they are chosen to be thick and stiff, the solder joints by which they are connected to the package and circuit board are subject to thermal cycling problems resulting in cracking and breakage. For these and other reasons, it has proven very difficult to design effective and durable packages for multichip modules.

It is therefore an object of the present invention to provide a package for a multichip module which is rugged and durable and is able to withstand shock and vibration without overstressing while also having a long thermal cycle life.

It is another object of the present invention to provide a package for a multichip module which provides accurate positioning of electrical leads with good lead-to-pad alignment as well as electrical lead co-planarity for reliable solder joint formation.

It is a further object of the present invention to provide a package for a multichip module in which the components of the package are matched with respect to their thermal expansion characteristics and in which appropriate interfaces are provided between components which are not matched with respect to their thermal expansion characteristics.

It is yet another object of the present invention to provide a package for a multichip module which has good hermeticity and hermeticity retention to protect against environmental influences, good thermal conductivity to keep IC junction temperatures low and good accessibility to the multichip module to allow for convenient repair of the module.

It is yet a further object of the present invention to provide a package for multichip modules which has the above-referenced desirable characteristics yet is economic to manufacture both for applications where full hermeticity is required and applications where only limited protection is required against adverse environmental conditions.

SUMMARY OF THE INVENTION

The present invention constitutes an improved package for a multichip module in which separate mechanisms are provided for mechanically attaching the package to a circuit board and for electrically connecting the package to the circuit board to which it is attached. The package includes a ceramic base on which the multichip module is supported, a retaining ring or frame which enables the attachment of the package to the circuit board and a lid for covering the top of the package and sealing it off from environmental influences. The package also includes a set of electrical leads extending from the interior to the exterior of the package for providing multiple separate connections between the multichip module and the circuit board on which it is mounted.

In a first embodiment, the ceramic base is a co-fired construction including a ledge extending around its perimeter having a number of electrical contact feedthroughs extending through it from the interior to the exterior of the base. A metal collar is also provided which is soldered to the base along the top of the ledge. The base, ledge and feedthroughs provide a particularly durable construction while the collar allows for a particularly rugged and fully hermetic enclosure. Further, the electrical leads which extend outward from the base for connection with the circuit board are attached to grapple bars which are coupled to the retaining ring and serve to ensure the alignment and co-planarity of the leads. Additionally, the lid is laser-welded to the collar in order to further guarantee hermeticity while allowing for access to the multichip module by removal of these welds when necessary for repair purposes.

In another embodiment, a flat base is used for supporting the multichip module and the electrical leads are provided on a TAB produced leadframe which is bonded in between the package base and the retaining ring. In this embodiment, a metal collar is not provided and the lid is attached to the retaining ring to seal off the package from environmental conditions. This package provides a somewhat lesser degree of protection against adverse environmental influences such as moisture but is substantially more economic to manufacture.

BRIEF DESCRIPTION OF THE DRAWINGS

FIGS. 2A, 2B and 2C provide an exploded view, a broken away perspective view and a cross-sectional view (along lines C—C of FIG. 2B), respectively, of a package for a multichip module in accordance with the present invention corresponding to a preferred embodiment which provides excellent hermeticity and an extremely rugged and durable construction.

FIGS. 3A, 3B and 3C provide an exploded view, a broken away perspective view and a cross-sectional view (along lines C—C of FIG. 3B), respectively, of a package for a multichip module in accordance with the present invention corresponding to another embodiment of the invention which may provide a somewhat lesser degree of hermeticity, but is nevertheless suitable for most commercial applications.

DESCRIPTION OF THE PREFERRED EMBODIMENT

Figure 1:
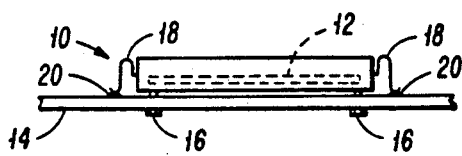
FIG. 1 provides a diagramatic side view of a package for a multichip module in accordance with the present invention as it would be mounted on a circuit board.

Referring now to FIG. 1, the present invention comprises a package 10 for mounting a multichip module 12 constructed, for example, of a silicon material on a printed circuit board 14 whereby the multichip module 12 is both mechanically secured and electrically connected to the circuit board 14. The mechanical connection between the package 10 and the circuit board 14 is accomplished by means of a set of bolts 16 which extend up through the circuit board 14 and engage the package 10. The electrical connection between the package 10 and the circuit board 14 is accomplished by means of a set of arcuately shaped leads 18 which extend out from the package 10 and which bear down on electrical pads 20 built into the circuit board 14.

Figure 2B:
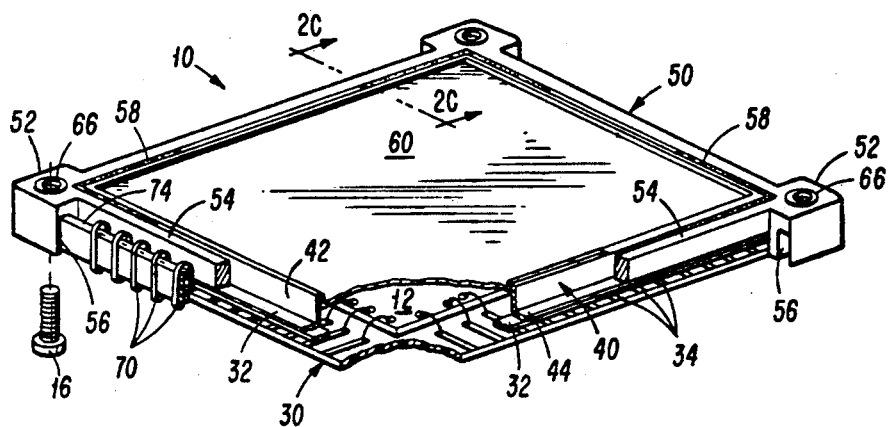
Figure 2C:
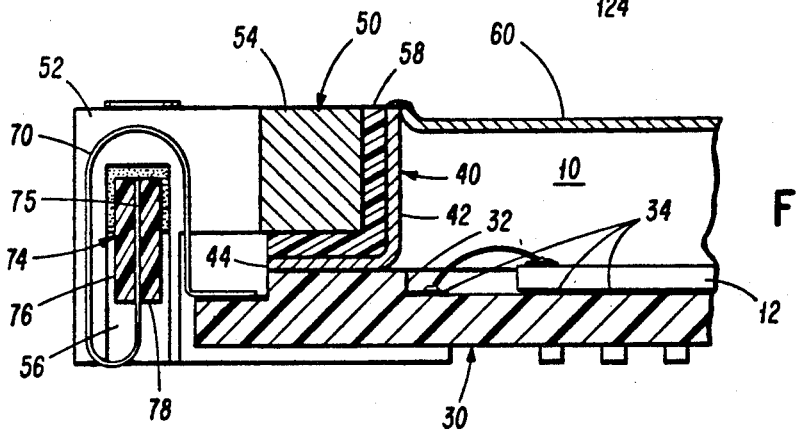

Referring now to FIGS. 2A, 2B and 2C, a preferred embodiment of the present invention is shown in the form of a hermetic package 10 which is adapted for sealing off the multichip module 12 from environmental influences and thus protecting the module and the chips which may be mounted on it from the adverse effects of exposure to moisture and the like. The package 10 includes a planar ceramic base 30 constructed of a material such as aluminum nitride having thermal expansion characteristics similar to the silicon used in the multichip module 12 and having good thermal conductivity for promoting the transfer of heat away from the module 12 during operation. The multichip module 12 is supported on the base 30 by being adhered to the interior area of the base with a thermally conductive silicone adhesive. The ceramic base 30 is specially constructed to include a ledge 32 extending around the perimeter of the base which is elevated from the surface of the base 30. A large number of metalized contacts 34 operative as electrical "feedthroughs" extend through the ledge 32 from the interior to the exterior of the base 30. The ledge 32 includes a very thin metalized layer 36 all along its top surface. The ledge 32, contacts 34 and metalized layer 36 are integral to the base 30 being part of a single co-fired construction which provides a particularly durable structure.

The package 10 also includes a collar 40 having vertically inclined side walls 42 and a horizontally inclined sill 44 which is adapted for engaging the ledge 32 of the base 30. The collar 40 is constructed of an iron-nickel alloy (61% iron and 39% nickel) matched to the thermal expansion characteristics of the base 30. The collar 40 is preferably soldered to the metalized layer 36 on the top of the ledge 32 using a eutectic solder alloy (e.g. 80% gold and 20% silver) whereby the collar 40 is attached to the base 30 all the way around the perimeter of the base 30.

The package 10 further includes a retaining ring 50 having four corner posts 52 and four side members 54 interconnecting the corner posts 52. The retaining ring 50 is constructed and arranged for fitting around the collar 40 with a small gap provided between the inner surfaces of the side members 54 and the outer surfaces of the side walls 42 of the collar 40. The retaining ring 50 is constructed of a glass reinforced polymer similar to the material used in the circuit board 14 and having similar thermal expansion characteristics. The retaining ring 50 is secured to the collar 40 using a RTV silicone elastomer 58 which is preferentially deployed between the ring 50 and the collar 40 in the areas adjacent to the corner posts 52. The bonding of the retaining ring 50 and collar 40 with the elastomer allows for the release of thermal stress through deformation of the elastomer without damage to the package 10. The corner posts 52 of the retaining ring 50 include vertical holes in which T-nuts 66 may be mounted either with epoxy or silicone elastomer (if further deformation potential is desired). The T-nuts 66 are engaged by bolts 16 running through the circuit board 14 on which the package 10 is mounted for mechanically attaching the package 10 to the circuit board 14. The corner posts 52 also include positioning slots 56 which are cut into the posts in pairs so that they face one another along the exterior sides of the retaining ring 50 and which have functions which will be later described.

The package 10 yet further includes a planar lid 60 adapted for mating with the collar 40 along its top edge 46 and covering the interior of the package 10 when secured thereto. The lid 60 is constructed of the same iron-nickel alloy as the collar 40 and is laser welded to the collar 40 all the way around the perimeter of the collar 40 so as to effect a hermetic seal. The collar 40 and lid 60 are interfaced along raised edges which enable laser welding to be readily performed. Further, the weld can be easily ground off for convenient access to the multichip module 12 inside the package 10 so as to allow for inspection and repair.

The package 10 also includes a large number of leads 70 which are individually soldered to the metalized contacts 34 along the perimeter of the base 30 exterior to the ledge 32 and which are arcuately shaped for bearing down on the electrical pads 20 in the circuit board 14 to which they are also individually soldered. The leads 70 comprise thin strips of copper or iron-nickel alloy which are constructed so as to be compliant (i.e. flexible and resilient) and thereby capable of responding to dimensional changes between the circuit board 14 and the base 30 without damage to their structure or to the solder joints by which they are connected to the metalized contacts 34 or pads 20. The leads 70 are divided into four subsets along the four sides of the package 10 which are attached to four grapple bars 74 which extend along the sides of the package 10 and assist with the alignment of the leads 70 both with respect to each other and with respect to the package 10, the circuit board 14 and especially the electrical pads 20. Each of the grapple bars 74 comprises two elongate segments 76 and 78 between which the ends 75 of the leads 70 are engaged in a sandwich construction cemented together with an epoxy adhesive. The longitudinal ends of the grapple bars 74 are constructed and arranged for fitting into the positioning slots 56 in the four corner posts 52 of the retaining ring 50 where they are cemented in place with an epoxy adhesive. The slots 56 are operative for aligning the grapple bars 74 and the leads 70 attached to them with respect to the electrical pads 20 on the circuit board 14 and thereby ensuring proper vertical and horizontal orientation of the leads 70 for contact with the proper pads to which the leads are soldered. In the preferred embodiment, the leads 70 are formed on mandrels to arcuate shapes approaching that of a short spirals with the grapple bars 74 deployed on the inside of the spiral structures.

The package 10 may also include a planar pad or gasket 80 of a thermally conductive material such as a boron nitride filled elastomer which is resident between the base 30 and circuit board 14 when the package is mounted on the circuit board. The pad 80 helps in transferring heat away from operational hot spots in the module 12.

When assembled, the package 10 illustrated in FIGS. 2A, 2B and 2C forms a rigid hermetic enclosure within which a multichip module may be mounted. The package 10 allows for secure mechanical attachment to a circuit board in a manner able to withstand shock and vibration without overstressing and allows for efficient electrical connection of the module to the circuit board through leads which are compliant and provide exceptional thermal cycling fatigue life. Furthermore, the package 10 includes a readily removable lid for improved repairability and provides good hermeticity due to it's rugged construction and especially the co-fired construction of the base. Additionally, the package 10 provides accurate electrical lead-to-pad alignment and ensures co-planarity of the leads through the action of the grapple bars 74 and their corresponding slots 56. Moreover, the entire package 10 is adapted for long thermal cycle life by careful matching of the thermal expansion characteristics of the components secured together and by careful interfacing of components which are not expansion matched so as to allow for relief of the resulting strains.

Figure 3B:
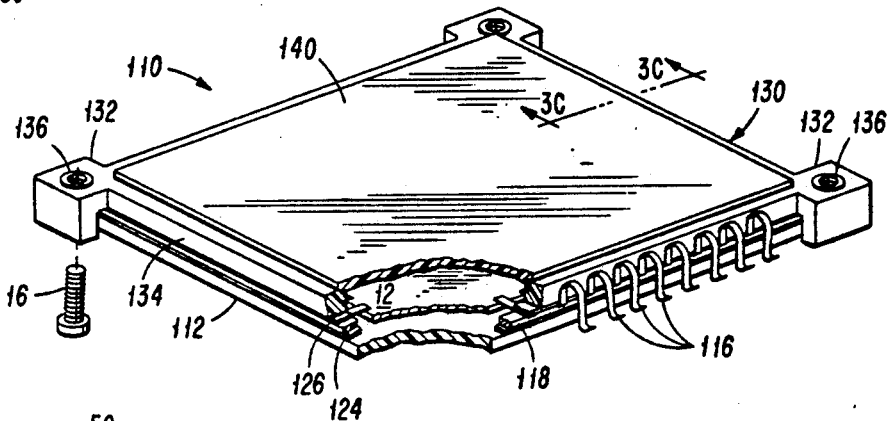
Figure 3C:
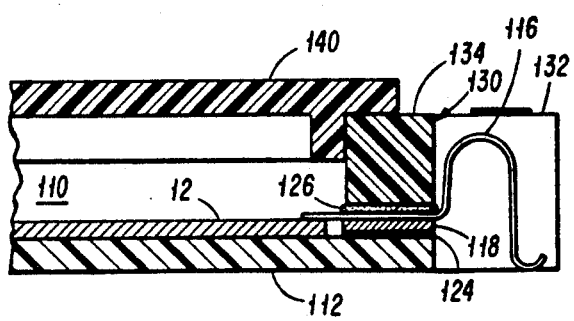

Referring now to the FIGS. 3A, 3B and 3C, an alternative preferred embodiment of the present invention is shown which is non-hermetic and provides a somewhat lesser degree of protection for the multichip module 12 from environmental influences, but is nevertheless suitable for many commercial applications and is more economical to produce. The package 110 includes a planar ceramic base 112 preferably constructed of a material such as aluminum nitride having thermal expansion characteristics matched to the silicon materials used in most multichip modules and good thermal conductivity for transferring heat away from the module during operations. In contrast to the base 30 shown in FIGS. 2A, 2B and 2C, the base 112 does not include any feedthroughs and simply consists of a flat sheet of material on which the multichip module may be supported by being adhered with a thermally conductive silicone adhesive. It should be noted that in the present embodiment the base 112 may be constructed of a range of materials including materials such as plastics which may not be fully matched to the thermal expansion characteristics of the module 12.

The electrical leads for the package are provided in the form of a leadframe 114 produced by tape automated bonding ("TAB") or flexible printed wiring techniques. The leadframe 114 comprises four sets of parallel and mutually aligned electrical contact strips 116 bonded onto a polymer carrier 118 which extends part of the way under strips 116. It should be noted with respect to FIG. 3A that the polymer carrier material 120 around the exterior of the leadframe 114 is trimmed away during the assembly process for the package 110 leaving the electrical contact strips 116 as supported by the (interior) polymer carrier 118. The polymer carrier 118 is adhered to the ceramic base 112 all the way around the perimeter of the base 112 with a silicone elastomer adhesive forming a thin elastomer filled layer 124 between the bottom surface of carrier 118 and the base 112. The retaining ring or hold-down ring 130 is preferably constructed of molded plastic and comprises four corner posts 132 interconnected by four side members 134. The hold-down ring 130 is constructed and arranged for engaging the polymer carrier 118 around the perimeter of the base 112 and is adhered to the top surface of the polymer carrier 118 with a silicone elastomer forming a thin elastomer filled layer 126 between the hold-down ring 130 and the polymer carrier 118 (and also the contact strips 116 bonded on top of the carrier). A molded plastic lid 140 is adapted for snapping onto the top of the hold-down ring 130 so as to cover the package 110 and thereby forming a sealed enclosure around the multichip module 12. The electric contact strips 116 are arcuately shaped exterior to the enclosure formed by the package 110 for bearing down on the electrical pads 20 in the circuit board 14 to which they are soldered. The contact strips 116 are formed on mandrels to arcuate shapes having gooseneck type profiles which are compliant for ensuring good thermal cycle life. The electrical contact strips 116 are individually connected to electrical contact points on the multichip module 12 by being soldered to them near their end points interior to the enclosure formed by the package 110. The corner posts 132 of the hold-down ring 130 include vertical holes in which T-nuts 136 are mounted either with epoxy or silicone elastomer (if further deformation potential is desired). The T-nuts 136 are engaged by bolts 16 running through the circuit board 14 on which the multichip module package 110 is mounted for mechanically attaching the package to the circuit board 14.

The multichip module package 110 provides a non-hermetic enclosure for a multichip module including separate mechanical mounting and electrical connection facilities. The package 110 is nevertheless sufficiently sealed to substantially protect against most adverse environmental influences. The package 110 also provides for the release of strain due to differentials in thermal expansion of the package components through deformation of the elastomer filled layers 124 and 126.

While particular embodiments of the present invention have been shown and described, it should be clear that changes and modifications may be made to such embodiments without departing from the true scope and spirit of the invention. It is intended that the appended claims cover all such changes and modifications.

I claim:
1. A package for mounting a multichip module onto a circuit board, comprising:
   an enclosure adapted for sealing off said module from environmental influences, said enclosure including:
   a planar ceramic base adapted for mechanically mounting said module, said base having an elevated ledge extending around its perimeter and a plurality of metalized contacts extending through said ledge for electrical connection with said module,
   a collar secured to said ledge around the perimeter of said base, and
   a lid secured to said collar;
   a retaining ring for use in securing said enclosure onto said circuit board which is engaged with said collar and base around the perimeter of said base; and
   a plurality of compliant electrical leads individually coupled to said metalized contacts along said base exterior to said ledge.

2. The package of claim 1, wherein said leads are arcuately shaped for bearing down on electrical pads built into said circuit board and further including one or more grapple bars attached to subsets of said electrical leads for aligning said leads with said pads and wherein said retaining ring includes slots operative for positioning said grapple bars.

3. The package of claim 1, wherein said base is constructed of aluminum nitride and said retaining ring is constructed of a polyamide material having expansion characteristics matched to said circuit board.

4. The package of claim 3, wherein said collar and lid are constructed of a metal alloy having expansion characteristics matched to said base and are laser welded together around the top of said collar along the perimeter of said lid.

5. The package of claim 1, further comprising a boron nitride filled elastomer gasket mounted between said base and said circuit board for enhancing the thermal conductivity of said package.

6. The package of claim 1, wherein said retaining ring is elastically engaged with said collar and base by means of a layer of silicone elastomer adhesive.

7. The package of claim 1, further including a set of T-nuts secured into said retaining ring and a corresponding set of bolts for use in attaching said package to said circuit board.

8. A package for mounting a multichip module on a circuit board, comprising:
   a planar ceramic base adapted for mounting said multichip module;
   a TAB-like leadframe including a plurality of electrical contact strips mounted on a polymer carrier which is adhered to said base around its perimeter;
   a frame structure adapted for securing said base and leadframe onto said circuit board including a hold-down ring for engaging said leadframe around the perimeter of said base;
   a first elastomer filled layer residing between said base and leadframe for sealing off said module from adverse environmental influences; and
   a second elastomer filled layer residing between said leadframe and hold-down ring for sealing off said module from adverse environmental influences.

9. The package of claim 8, wherein said base is constructed of aluminum nitride.

10. The package of claim 8, wherein said frame includes a hold-down ring for engaging said leadframe and a lid which may be attached to said ring for sealing off said package from environmental influences.

11. A package for mounting a multichip module on a circuit board, comprising:
    an enclosure including a planar base having an elevated ledge extending around its perimeter and having a plurality of metalized contacts extending through said ledge for electrical connection to said module and including a collar secured to said ledge around the perimeter of said base for use in supporting said module and further including a frame structure for engaging said base around its perimeter and sealing off said module from adverse environmental influences;
    means for mechanically attaching said enclosure to said circuit board; and
    means for electrically connecting said module to said circuit board separate from said means for mechanically attaching said enclosure to said circuit board.

12. The package of claim 11, wherein said means for electrically connecting said module to said circuit board includes a plurality of compliant electrical leads individually coupled to said metalized contacts along said base exterior to said ledge.

13. A package for mounting a multichip module on a circuit board, comprising:
    a planar ceramic base adapted for mounting said multichip module;
    a TAB-like leadframe including a plurality of electrical contact strips which are arcuately shaped for bearing down on electrical pads built into said circuit board and which are mounted on a polymer carrier which is adhered to said base around its perimeter; and
    a frame structure adapted for securing said base and leadframe onto said circuit board by engaging said leadframe around the perimeter of said base and for sealing off said module from environmental influences.

* * * * *